United States Patent [19]

Takemae

[11] 4,443,720
[45] Apr. 17, 1984

[54] BOOTSTRAP CIRCUIT

[75] Inventor: Yoshihiro Takemae, Yokohama, Japan

[73] Assignee: Fujitsu Limited, Kawasaki, Japan

[21] Appl. No.: 215,630

[22] Filed: Dec. 12, 1980

[30] Foreign Application Priority Data

Dec. 19, 1979 [JP] Japan ................................ 54-165013

[51] Int. Cl.³ ............................................ H03K 5/01
[52] U.S. Cl. .................................... 307/578; 307/268; 307/482
[58] Field of Search ............... 307/270, 264, 482, 578, 307/304, 269, 268, 246

[56] References Cited

U.S. PATENT DOCUMENTS 3,764,823 10/1973 Donofrio et al. .................... 307/482
3,774,055 11/1973 Bapat ................................. 307/279
3,898,479 8/1975 Proebsting ........................ 307/482
4,061,933 12/1977 Schroeder et al. ................. 307/262
4,199,695 4/1980 Cook et al. ........................ 307/578

Primary Examiner—John Zazworsky
Attorney, Agent, or Firm—Staas & Halsey

[57] ABSTRACT

A bootstrap circuit in which a load MOS transistor and a drive MOS transistor are connected in series between a high potential source and a low potential source to form an inverter, a capacitor is connected to an output terminal of the inverter, and a circuit for charging the capacitor and a circuit for discharging the capacitor are connected to the capacitor, the circuit for discharging the capacitor being connected between said capacitor and the low potential source and containing a MOS transistor which is rendered conductive by a reset signal applied to its gate. The present invention involves another MOS transistor having its gate connected to the high potential source being inserted between the MOS transistor in the discharge circuit and the capacitor.

9 Claims, 7 Drawing Figures

BOOTSTRAP CIRCUIT

BACKGROUND OF THE INVENTION

The present invention relates to a bootstrap circuit, and more specifically to a bootstrap circuit which is used in a MOS (metal oxide semiconductor) integrated circuit such as a circuit for generating clock pulses to drive word lines.

A bootstrap circuit used in a MOS integrated circuit is constructed, and mentioned below and has been disclosed, for example, in the U.S. Pat. No. 3,744,055. Namely, a load MOS transistor and a drive MOS transistor are connected in series between a high potential source and a low potential source thereby forming an inverter, and a capacitor is connected between the point at which the above-mentioned two transistors are connected together and the gate of the above-mentioned load transistor. Further, a circuit for electrically charging the capacitor and a circuit for discharging the capacitor are connected to the terminal of the capacitor which is connected to the gate of the load transistor. The discharge circuit includes a MOS transistor that is connected between the terminal of the capacitor connected to the gate of the load transistor and the above-mentioned low potential source. The discharge circuit is rendered conductive to discharge the above-mentioned capacitor when a reset signal is applied to the gate of the MOS transistor.

In the bootstrap circuit constructed as mentioned above, the potential at the terminal of the capacitor that is connected to the gate of the load transistor before the discharge takes place is higher than the potential of the high potential source. Therefore, a high voltage is impressed between the drain and the source of the MOS transistor in the discharge circuit during the initial stage of the discharge, while the potential of the reset signal applied to the gate is smaller than that of the high-potential source. Consequently, the MOS transistor operates in a deeply saturated region. When a MOS transistor operates in a deeply saturated region, in general, hot electrons of high energy are generated in large amounts and are captured by the gate oxide film, causing the threshold voltage to undergo variation. Even putting aside the generation of hot electrons, the flow of current in the deeply saturated region brings the transistor closer to the state of punch-through or break-down, and this is never desirable.

SUMMARY OF THE INVENTION

The object of the present invention is to provide a bootstrap circuit which is free from the defects inherent in the conventional counterparts, and which eliminates the problem of variation in the threshold voltage of the MOS transistor in the conventional discharge circuit.

Another object of the present invention is to provide a bootstrap circuit which is so constructed as to prevent the MOS transistor in the discharge circuit from breaking down.

The above-mentioned objects of the present invention involve a bootstrap circuit in which a load MOS transistor and a drive MOS transistor are connected in series between a high potential source and a low potential source to form a inverter, in which a capacitor is connected between an output terminal of the inverter and the gate of the load transistor, and a circuit for charging the capacitor and a circuit for discharging the capacitor are connected to the terminal of the capacitor which is connected to the gate of the load transistor, the circuit for discharging the capacitor being connected between the terminal of the capacitor which is connected to the gate of the load MOS transistor and the low potential source and further containing a first MOS transistor which is rendered conductive upon receipt of a reset signal. The invention comprises a second MOS transistor with its gate connected to the high potential source being inserted between the first MOS transistor of the discharge circuit and the terminal of the capacitor connected to the gate of the load MOS transistor.

Further features and advantages of the present invention will become apparent from the ensuing description with reference to the accompanying drawings to which, however, the scope of the invention is in no way limited.

DETAILED DESCRIPTION OF THE PREFERRED EMBODIMENTS

Figure 1:
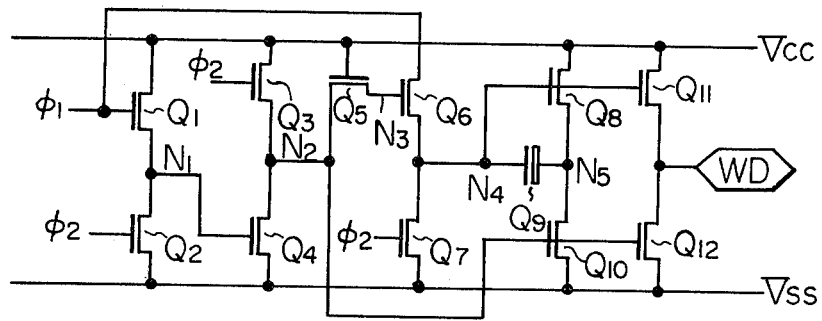
FIG. 1 is a diagram illustrating a circuit which generates a signal for driving word lines, employing a conventional bootstrap circuit.

A bootstrap circuit is typically used in circuits with MOS transistors. FIG. 1 illustrates a typical circuit which generates a signal WD to drive word lines, in which transistors $Q_6$, $Q_7$, $Q_8$, $Q_{10}$ and a capacitor $Q_9$ form a conventional bootstrap circuit. A signal $N_3$ for driving the transistor $Q_6$ of the bootstrap circuit is generated by a circuit which consists of MOS transistors $Q_1$ to $Q_5$. The transistors $Q_1$ and $Q_2$ constitute an inverter which operates when clock pulses $\phi_1$ and $\phi_2$ of opposite phases are applied thereto, and the transistors $Q_3$ and $Q_4$ constitute an inverter which operates when the clock pulse $\phi_2$ and an output $N_1$ of the preceding stage are applied thereto. The transistor $Q_5$ is connected between an output terminal $N_2$ of the inverter of the second stage and the gate $N_3$ of the transistor $Q_6$.

Referring to FIG. 1, the bootstrap circuit comprises for example, N-channel MOS transistors $Q_6$, $Q_7$, $Q_8$ and $Q_{10}$ and the capacitor $Q_9$, wherein the load transistor $Q_8$ and the drive transistor $Q_{10}$ constitute an inverter. A MOS capacitor $Q_9$ is connected between an output terminal $N_5$ of the above inverter and the gate of the transistor $Q_8$. A circuit for charging the capacitor $Q_9$ which includes the transistor $Q_6$ is connected to the terminal (connection point $N_4$) of the capacitor $Q_9$ which is connected to the gate of the transistor $Q_8$. A circuit for discharging the capacitor $Q_9$ which includes the transistor $Q_7$ is also connected to the side terminal (connection point $N_4$) of the capacitor $Q_9$ which is connected to the gate of the transistor $Q_8$. The other end of the transistor $Q_7$ (i.e., the source of the transistor $Q_7$, since the transistors employed here are all assumed to be of the N-channel type) is connected to a low potential source $V_{SS}$. When the signals at $N_3$ and $N_2$ are at a high level to render the transistors $Q_6$, $Q_{10}$ conductive, and when the clock pulse $\phi_1$ at a high ($V_{CC}$) level is applied, the capacitor $Q_9$ is electrically charged through the path $Q_6$-$Q_9$-$Q_{10}$-$V_{SS}$, whereby the potential at the point $N_4$ effects the initial step of the bootstrapping for the transistors $Q_8$ and $Q_{11}$ and acquires the potential of the clock pulse $\phi_1$. When the signals $N_3$, $N_2$ assume the low level under this state, the output terminal $N_5$ is electrically disconnected from the low potential source $V_{SS}$, and is driven to the level of the high potential source $V_{CC}$ by the transistor $Q_8$. Therefore, the potential at the point $N_4$ is raised by the stored electric charge of the capacitor $Q_9$ to be greater than that of the high potential source $V_{CC}$. The potential at the point $N_4$ usually becomes 1.7 to 1.8 times greater than that of the high potential source $V_{CC}$. Therefore, the load transistor $Q_8$ is completely turned on, and the voltage of the power supply $V_{CC}$ directly appears at the output terminal $N_5$ without being affected by the threshold voltage $V_{th}$ of the transistor $Q_8$. When the transistor $Q_8$ is simply turned on without utilizing the bootstrapping function, the output level at the output terminal $N_5$ is simply $V_{CC}$-$V_{th}$ as is widely known, and is not quite sufficient for driving the word lines of the semiconductor memories that require a high voltage.

In the circuit of FIG. 1, a signal WD for driving the word lines is derived from a connection point between an MOS transistor $Q_{11}$, the gate of which is controlled by the potential at the point $N_4$ like the transistor $Q_8$, and a transistor $Q_{12}$ of which the gate is controlled by the potential at the point $N_2$ like the transistor $Q_{10}$.

Figure 2:
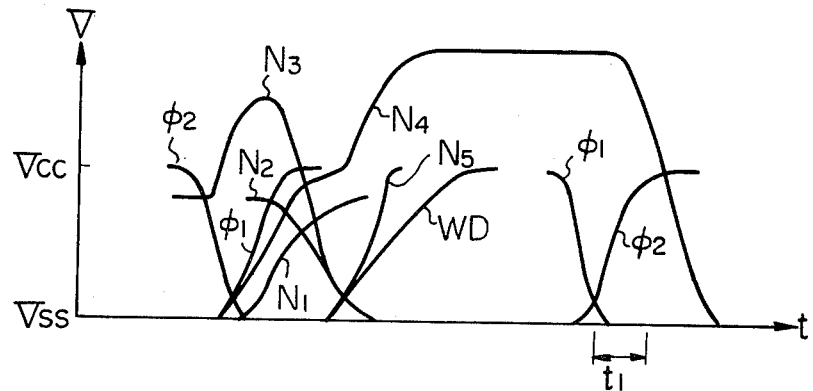
FIG. 2 is a diagram illustrating the operating waveforms at major points of the circuit of FIG. 1.

The operation of the circuit will now be explained below with reference to the waveforms of FIG. 2. In the initial state in which the clock pulse $\phi_1$ is at the low level ($V_{SS}$) and the clock pulse $\phi_2$ is at the high level ($V_{CC}$), the transistors $Q_2$ and $Q_3$ are conductive so that the potential at the point $N_1$ is at the low level and the potential at the point $N_2$ is at the high level ($V_{CC}$-$V_{th}$), and the transistor $Q_5$ is conductive so that the potential at the point $N_3$ is raised to $V_{CC}$-$V_{th}$. When the clock pulse $\phi_1$ is changed to the high level and the clock pulse $\phi_2$ to the low level, the transistors $Q_1$ and $Q_4$ are rendered conductive, whereby the potential at the point $N_1$ is raised and the potential at the point $N_2$ is lowered. Hence, the transistor $Q_5$ is rendered non-conductive. In this case, since the clock pulse $\phi_1$ assumes the high level, the level at the point $N_3$ is raised to become greater than $V_{CC}$+$V_{th}$, and the transistor $Q_6$ is rendered completely conductive (without being affected by the drop in the threshold voltage $V_{th}$). Further, since the transistor $Q_{10}$ remains conductive for a short period of time during which the potential at the point $N_2$ is greater than the $V_{th}$ of transistor $Q_{10}$, an electric current flows through the path $\phi_1(V_{CC})$-$Q_6$-$N_4$-$Q_9$-$Q_{10}$-$V_{SS}$ so that the capacitor $Q_9$ is electrically charged until the potential at the point $N_4$ reaches $V_{CC}$. Then, as the potential at the point $N_2$ gradually decreases to become smaller than $V_{th}$, the transistor $Q_{10}$ is rendered non-conductive and the potential at the point $N_4$ is raised to be greater than $V_{CC}$ (ideally $2V_{CC}$) by the stored electric charge of the capacitor $Q_9$. Consequently, the potential at the point $N_5$ becomes $V_{CC}$, and the clock pulse WD assumes the potential $V_{CC}(H)$. Thereafter, as the clock pulses $\phi_1$ and $\phi_2$ are inverted, the transistor $Q_7$ is rendered conductive by the clock pulse $\phi_2$ at the high level, and the electric charge accumulated in the capacitor $Q_9$ is discharged as mentioned above through the path $Q_9$-$N_4$-$Q_7$-$V_{SS}$. Thus, the bootstrap circuit is reset.

Figure 3:
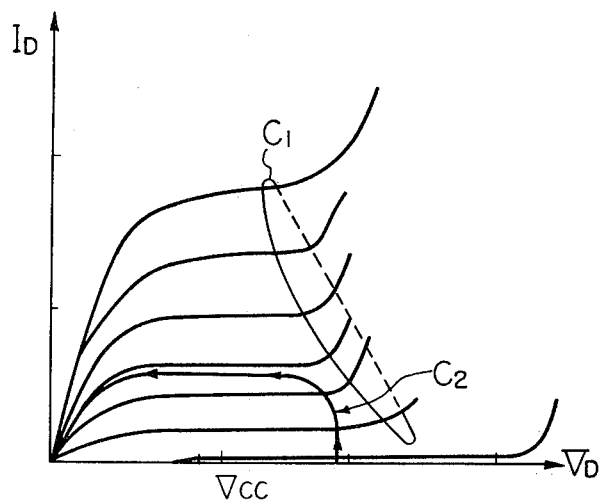
FIG. 3 is a diagram illustrating the operating characteristics of a resetting transistor in the circuit of FIG. 1.

In the bootstrap circuit reset as above, the potential at the point $N_4$, before the discharge in a reset period ($t_1$ in FIG. 2) takes place, is greater than the potential $V_{CC}$ as mentioned earlier. During the initial stage of the discharge, therefore, a high voltage is applied between the drain and the source of the transistor $Q_7$, while the gate voltage $\phi_2$ is lower than $V_{CC}$. Consequently, the transistor $Q_7$ operates in a deeply saturated region. FIG. 3 illustrates changes in the transistor characteristics during the discharge step. Namely, FIG. 3 shows the $V_D$-$I_D$ characteristics $C_1$ of the transistor $Q_7$ with the gate voltage as a parameter, and $C_2$ represents the locus of the operating region through which the transistor $Q_7$ passes when the electric charge is discharged at the point $N_4$. When the MOS transistor operates in a deeply saturated region, in general, hot electrons of high energy are generated in large amounts and are captured by the gate oxide film, causing the threshold voltage $V_{th}$ to undergo variation. Even putting aside the generation of hot electrons and hot holes, the flow of current in the deeply saturated region is liable to cause punch-through or break down, and this is never desirable.

In the present invention, the bootstrap circuit having a discharge circuit which includes the first MOS transistor of the circuit of FIG. 1 described above is improved by the provision of a second MOS transistor which is connected between the first MOS transistor in the discharge circuit and the terminal of the capacitor connected to the gate of the load transistor, the gate of the second MOS transistor being connected to the high potential source. The present invention will be described below in detail with reference to a schematic embodiment.

Figure 4:
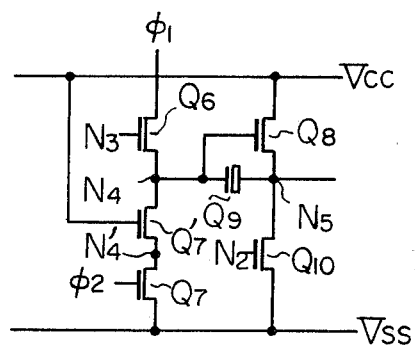
FIG. 4 is a block diagram of a bootstrap circuit according to an embodiment of the present invention.

FIG. 4 illustrates an embodiment of the present invention in which a MOS transistor $Q_7'$ is added to the reset circuit of FIG. 1. Namely, the first and second MOS transistors $Q_7$ and $Q_7'$ are connected in series between the point $N_4$ and the low potential source $V_{SS}$, a reset signal $\phi_2$ is applied to the gate of the first transistor $Q_7$, and the gate of the second transistor $Q_7'$ is connected to the high potential source $V_{CC}$. Accordingly, the potential at the point $N_4$ is divided by the transistors $Q_7$ and $Q_7'$, and the potential at a point $N_4'$ on the side of the drain of the transistor $Q_7$ becomes considerably smaller than the potential at the point $N_4$. More specifically, since the gate of the transistor $Q_7'$ is connected to the high potential source $V_{CC}$, the potential at the point $N_4'$ does not become greater than $V_{CC}$-$V_{th}$. Hence, the transistor operates less in the deeply saturated region, and the energy of the electrons is reduced. In the case of the circuit of FIG. 1, even if the effect by the hot electrons is disregarded, the drain and source of the transistor $Q_7$ are impressed with a voltage which is so great as to risk breakdown, and such a high voltage is not desirable as it may destroy the element. According to the circuit of the present invention, on the other hand, a reduced voltage is applied across the drain and the source of transistor $Q_7$, and there is no probability that the transistor $Q_7$ may be destroyed. The transistor $Q_7'$ is provided with a differential voltage between the point $N_4$ and the point $N_4'$. The differential voltage, however, is smaller than $V_{CC}$, and therefore less hot electrons are generated in the transistor $Q_7'$ and there is less risk of destroying the element. It is not desirable to connect the gate of the transistor $Q_7'$ to the point $N_4$, because this would simply reduce the potential at the point $N_4'$ by a threshold voltage $V_{th}$ relative to the potential at the point $N_4$. Furthermore, when the gate of the transistor $Q_7'$ is connected to the point $N_4$, there arises a problem specific to the bootstrap circuit, i.e., the gate capacity of the transistor $Q_8$ and the gate capacity of the transistor $Q_7'$ become loads as viewed from the capacitor $Q_9$. Therefore, the potential at the connection point $N_4$ does not rise when the bootstrap operates, the mutual conductance gm of the transistor $Q_8$ is decreased, and it becomes difficult to increase the output level at the output terminal $N_5$. None of the above-mentioned problems, however, develop when the gate of the transistor $Q_7'$ is connected to the high potential source $V_{CC}$.

Figure 5:
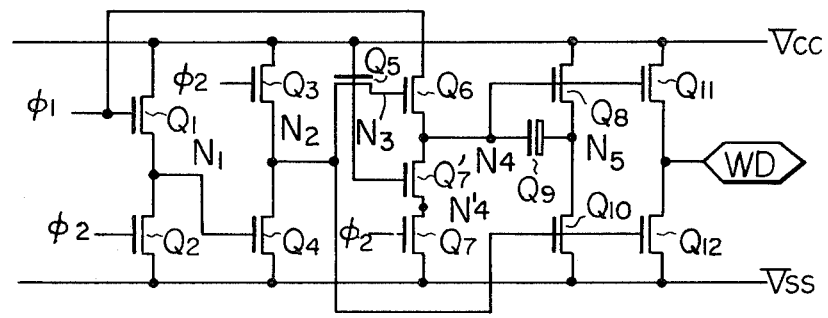
FIG. 5 is a diagram illustrating a circuit which generates a signal for driving word lines, employing the bootstrap circuit according to the present invention.
Figure 6:
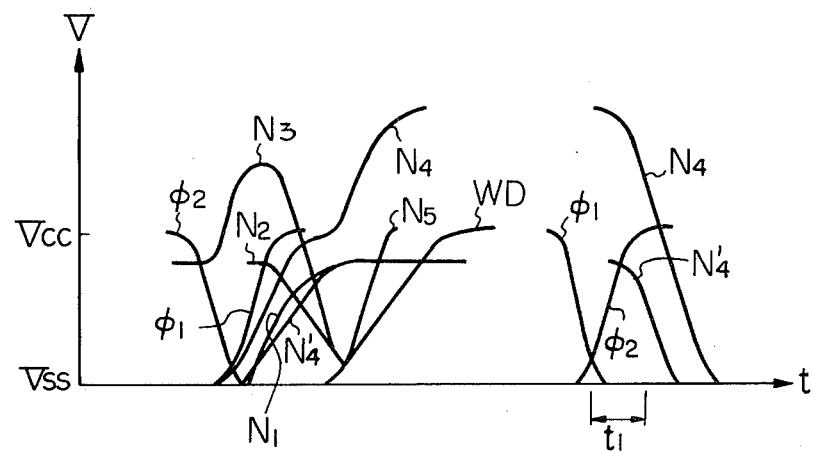
FIG. 6 is a diagram illustrating the operating waveforms at major points of the circuit of FIG. 5.
Figure 7:
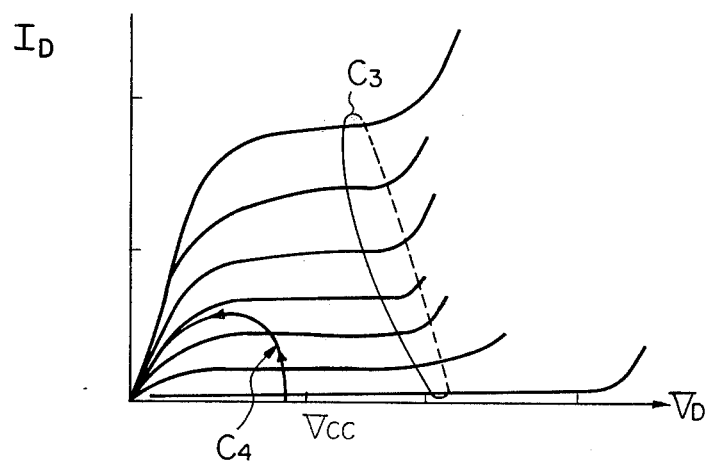
FIG. 7 is a diagram illustrating the operating characteristics of a resetting transistor in the circuit of FIG. 5.

FIG. 5 shows a circuit which generates a signal WD for driving word lines according to the present invention. The provision of the transistor $Q_7'$, like that in FIG. 4, makes the circuit of FIG. 5 different from the circuit of FIG. 1. The operation of this circuit will be easily understood from FIG. 4 and FIG. 1, and is not further described here. FIG. 6 illustrates voltage waveforms at each portion of the circuit, and FIG. 7 illustrates the locus $C_4$ of the operating region through which the transistors $Q_7$, $Q_7'$ pass when the electric charge is discharged at the point $N_4$. This shows the $V_D$-$I_D$ characteristics $C_3$ of the transistors $Q_7$, $Q_7'$ with the gate voltage as a parameter. Referring to FIG. 6, a peak value at the point $N_4'$ is nearly equal to $V_{CC}$-$V_{th}$, which is about one-half the value at the point $N_4$. Therefore, as represented by the curve $C_4$ in FIG. 7, the drain voltage $V_D$ at which the transistors $Q_7$, $Q_7'$ start to discharge is about one-half the initial value which is represented by the curve $C_2$ in FIG. 3.

According to the present invention as mentioned above, a high voltage which is raised by the bootstrap circuit is not directly applied across the drain and the source of the MOS transistor which constitutes a reset circuit in the bootstrap circuit. Therefore, the transistor is not destroyed, and hot electrons of high energy are not generated in large amounts to vary the threshold voltage $V_{th}$.

I claim:

1. In a bootstrap circuit in which a load MOS transistor and a drive MOS transistor are connected in series between a first potential source and a second potential source to form an inverter, with a terminal between said load and drive transistors, a capacitor has a first of two terminals connected to said terminal of said inverter, a circuit for charging said capacitor and a circuit for discharging said capacitor are connected to the other terminal of said capacitor, said circuit for discharging said capacitor being connected between said other terminal of said capacitor and said second potential source and comprising a first MOS transistor which is connected at its source and drain to allow said capacitor to discharge therebetween when said first MOS transistor is rendered conductive by a reset signal that is applied to the gate of said first MOS transistor, the improvement comprising second MOS transistor connected at its drain and source between said first MOS transistor of said discharge circuit and said other terminal of said capacitor, and means for continuously supplying a constant voltage to the gate of said second MOS transistor, wherein the value of said constant voltage is selected to reduce the voltage across said source and drain of said first MOS transistor, during the time that said reset signal is applied to discharge said capacitor, to a value sufficiently below (1) the difference between (a) the voltage of said other terminal of said capacitor and (b) the voltage of said second potential source, (2) less the threshold voltage of said second MOS transistor, so as to sufficiently avoid the risk of punch-through or breakdown of said first MOS transistor, wherein said constant voltage is continuously supplied to the gate of said second MOS transistor including during said charging and discharging of said capacitor.

2. The circuit of claim 1, wherein the gate of said second MOS transistor is connected to said first potential source.

3. The circuit of claim 1 or 2, wherein the gate of said load transistor is connected to said other terminal of said capacitor.

4. The circuit of claim 1 or 2, said first and second MOS transistors being of the N-channel type, and said first and second potential sources being high and low voltage levels, respectively.

5. The circuit of claim 3, said first and second MOS transistors being of the N-channel type, said first and second potential sources being high and low voltage levels, respectively.

6. The circuit of claim 1 or 2, said gate of said second MOS transistor being continuously connected to said first potential source.

7. The circuit of claim 3, said gate of said second MOS transistor being continuously connected to said first potential source.

8. The circuit of claim 4, said gate of said second MOS transistor being continuously connected to said first potential source.

9. The circuit of claim 5, said gate of said second MOS transistor being continuously connected to said first potential source.

* * * * *

UNITED STATES PATENT AND TRADEMARK OFFICE
CERTIFICATE OF CORRECTION

PATENT NO. : 4,443,720
DATED : April 17, 1984
INVENTOR(S) : YOSHIHIRO TAKEMAE

It is certified that error appears in the above-identified patent and that said Letters Patent is hereby corrected as shown below:

Column 1, line 11, "and" (first occurrence) should be --as--.

Column 3, line 33, "of which the gate" should be --, the gate of which--.

Signed and Sealed this

*First* Day of *January 1985*

[SEAL]

*Attest:*

*Attesting Officer*

GERALD J. MOSSINGHOFF
*Commissioner of Patents and Trademarks*